US006323791B1

(12) United States Patent
Murden et al.

(10) Patent No.: US 6,323,791 B1
(45) Date of Patent: Nov. 27, 2001

(54) CONTROL SYSTEMS AND METHODS FOR REDUCING RESIDUE SIGNAL OFFSET IN SUBRANGING ANALOG-TO-DIGITAL CONVERTERS

(75) Inventors: Frank Murden; Joe Young, both of Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/416,982

(22) Filed: Oct. 13, 1999

(51) Int. Cl.[7] ................................................. H03M 1/00
(52) U.S. Cl. ............................................ 341/118; 341/120
(58) Field of Search .................................. 341/118, 120, 341/143, 155

(56) References Cited

U.S. PATENT DOCUMENTS

| | | | |
|---|---|---|---|
| 4,996,530 | * | 2/1991 | Hilton ................................... 341/120 |
| 6,028,546 | * | 2/2000 | Signell et al. ........................ 341/161 |
| 6,166,668 | * | 12/2000 | Bautista et al. ..................... 341/118 |

OTHER PUBLICATIONS

Kester, Walt, et al., High Speed Design Techniques, Analog Devices, Inc., Norwood, MA., 1996, pp. 4–36 to 4–47.

* cited by examiner

Primary Examiner—Peguy JeanPierre
Assistant Examiner—Joseph J Lauture
(74) Attorney, Agent, or Firm—Koppel & Jacobs

(57) ABSTRACT

Feedback control systems and methods are provided for correcting residue signal offset errors in subranging ADCs. The systems and methods eliminate clock-to-clock offset changes and reduce noise generation. An exemplary control system includes a feedback loop around a residue sampler and a residue amplifier that includes a) a feedback sampler that resamples the output signal of the residue sampler to produce a resampled residue signal, and b) an offset current generator that delivers an offset current to the residue amplifier with a current magnitude that is responsive to the resampled residue signal. The sampling of the residue and feedback samplers is time shifted to block the propagation of spurious signals that are typically generated in DACs of the subranging structure.

24 Claims, 5 Drawing Sheets

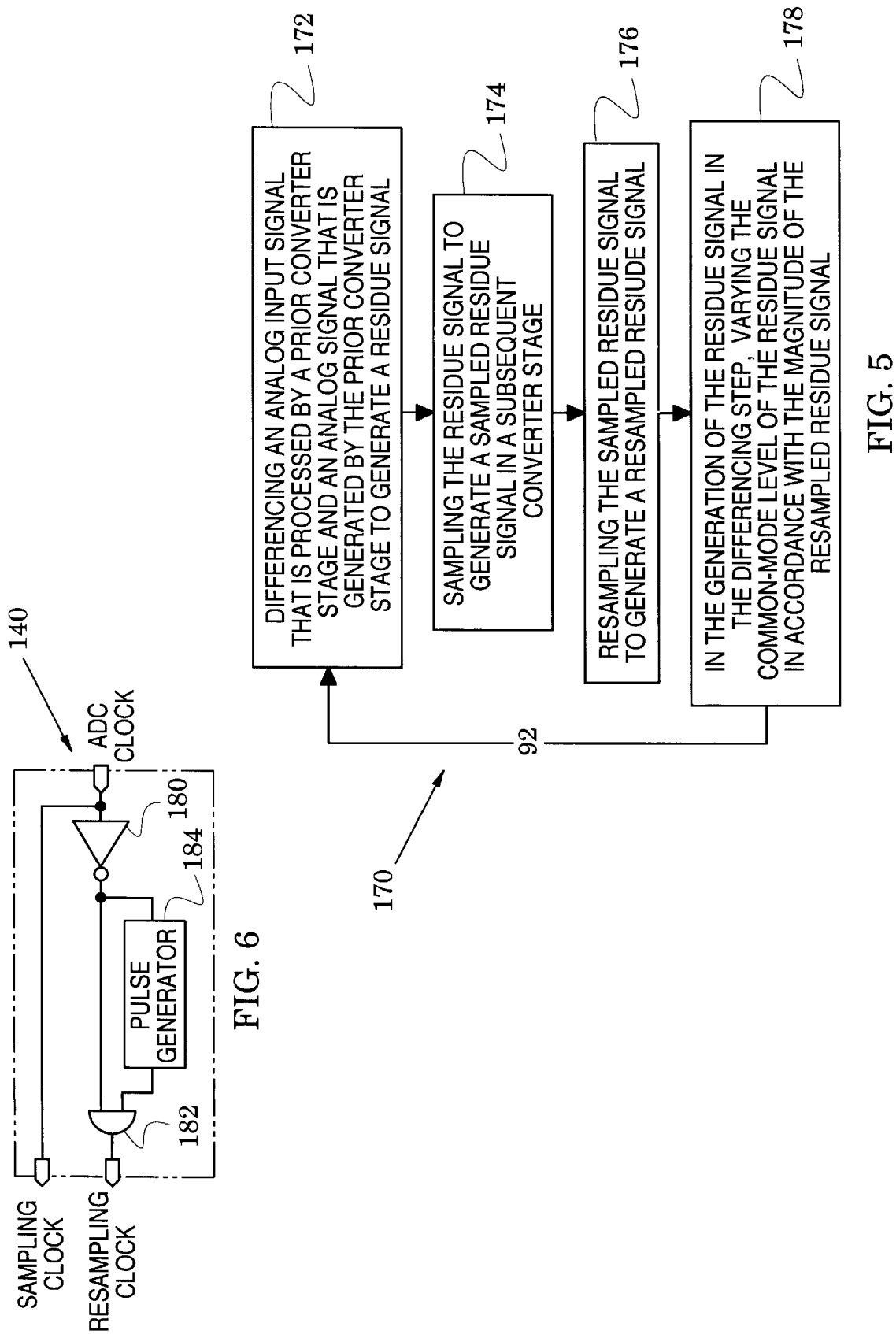

CONTROL SYSTEMS AND METHODS FOR REDUCING RESIDUE SIGNAL OFFSET IN SUBRANGING ANALOG-TO-DIGITAL CONVERTERS

BACKGROUND OF THE INVENTION

1. Field of the Invention

The present invention relates generally to analog-to-digital converters and more particularly to subranging analog-to-digital converters.

2. Description of the Related Art

As shown in various references (e.g., Kester, Walt, et al., High Speed *Design Techniques, Analog Devices*, Inc., Norwood, Mass. 1996), a subranging analog-to-digital converter (ADC) generally has N successive converter stages so that it has at least one combination of a prior converter stage and a corresponding subsequent converter stage. Except for a terminal stage, each converter stage quantizes an analog input signal into a respective number of digital bits, subtracts from the input signal an analog signal corresponding to the digital bits and passes the resulting residue signal to its corresponding subsequent converter stage for further quantization. The terminal converter stage receives the last residue signal and generates a corresponding set of least significant bits.

As illustrated in FIG. 1, an exemplary subranging ADC 20 includes a prior converter stage 22 and a subsequent converter stage 24. In the prior converter stage, a prior sampler 28 forms a sampled input signal 30 from an analog input signal 32. The sampled signal is quantized by a prior ADC 34 in the prior converter stage to form a set of prior digital bits 35 that are stored in a buffer register 36.

A prior digital-to-analog converter (DAC) 40 responds to the prior digital bits 35 by forming a corresponding analog signal 42 and this signal and the sampled input signal 30 are differenced in a subtractor 44 to form a residue signal 46 which is amplified by a residue amplifier 48 to provide a signal range to the subsequent converter stage that can be effectively processed. To enhance formation of the residue signal, the sampled input signal 30 is typically delayed by a delay 50 which is often formed with another sampler.

In the subsequent converter stage 24, the residue signal 46 is sampled in a subsequent sampler 52 and quantized by a subsequent ADC 54 to form a set of subsequent digital bits 55 that are less significant than the prior digital bits 35. Both sets of digital bits are communicated to output registers 58 to form a digital output 60 that corresponds to the analog input signal 32. The subranging ADC 20 may also include an error correction logic system 56. In this case, the prior converter stage 24 generally quantizes at least one more digital bit than required and this process is combined with the error correction logic 56 to correct many of the conversion errors of typical uncorrected ADCs.

If the subsequent converter stage 24 is the terminal converter stage, the digital bits 55 are the least significant bits of the conversion process. Otherwise, the subsequent converter stage contains further structure that is similar to that of the prior converter stage as indicated by broken lines 62. With this additional structure it can generate and pass a residue signal to its respective subsequent converter stage. The prior and subsequent ADCs 34 and 54 are typically formed with a serial arrangement of single-bit ADCs (e.g., preliminary stages of folding amplifiers and a final comparator stage).

To prevent converter errors (e.g., non-linearities and missing codes), the range of each residue signal must match the signal input range of its subsequent converter stage. Because subranging ADCs generally process differential signals, this range match can only be realized if the magnitude of the residue signal is proper and if its common-mode level approximates a predetermined level. Differences from the predetermined level (i.e., offset errors) must be controlled and reduced to an acceptable level.

Operational processes in the subtractor 44 and the residue amplifier 48 generally include the noise-generation process of passing currents through resistors. This noise generation is often reduced by eliminating the subtractor 44 of FIG. 1 and performing its processes with currents that pass through gain-setting resistors within the residue amplifier. In order to match the range magnitude of the subsequent converter stage, the gain of the residue amplifier is generally substantial so that the gain-setting resistors have large resistances (e.g., >1000 ohms).

In one conventional control system, offset errors are reduced by inserting a fixed, predetermined offset current across the gain-setting resistors. Because of the large resistance of these resistors, small errors in the fixed offset current are magnified and an uncorrected offset error results. In addition, application of a fixed offset current in one converter stage has no effect on uncorrected offset errors in a prior converter stage.

In another conventional control system, the fixed current source is replace with a variable one that is responsive to a feedback control loop that is formed around the residue amplifier 48. In this loop, the residue signal offset is sensed at the output of the residue amplifier 48, compared with a reference signal in an integrator to generate an error signal, and the error signal applied to the variable offset current source.

As mentioned above, the residue amplifier 48 typically has a substantial gain. It therefore magnifies spurious signals that are generated by cell switching in the prior DAC 40 and the feedback loop causes the common-mode level to change on a clock-to-clock basis. The resulting degradation in converter performance becomes particularly troublesome at high speed clock rates (e.g., on the order of 80 million samples per second (MSPS)).

SUMMARY OF THE INVENTION

The present invention is directed to feedback control systems that reduce offset errors in residue signals of subranging ADCs. In particular, it is directed to control systems that avoid undesirable effects of conventional offset error control systems (e.g., uncorrected offset errors and clock-to-clock offset changes).

These goals are achieved with a feedback control method that includes the process steps of:

a) differencing an analog input signal that is processed by the prior converter stage and an analog output signal that is generated by the prior converter stage to generate the residue signal;

b) sampling the residue signal to generate a sampled residue signal in the subsequent converter stage;

c) resampling the sampled residue signal to generate a resampled residue signal; and d) in the generation of the residue signal in the differencing step, varying the common-mode level of the residue signal in accordance with the magnitude of the resampled residue signal.

In particular, the resampling step generates a resampled residue signal that is responsive to the common-mode level of the sampled residue signal. By shifting the sampling and resampling steps so that they are not time coincident, spurious signals are blocked from propagating to the resampled residue signal. Accordingly, offset errors of previous converter stages are corrected and clock-to-clock offset changes are eliminated.

These process steps can be realized with:

a) a residue amplifier in a prior converter stage that generates, in response to an input signal, a residue signal with a common-mode level that is responsive to an offset current;

b) a residue sampler in a subsequent converter stage that samples the residue signal to produce a sampled residue signal; and c) a feedback loop around the residue sampler and the residue amplifier that includes:

1) a feedback sampler that resamples the sampled residue signal to produce a resampled residue signal; and 2) an offset current generator that delivers the offset current to the residue amplifier with a current magnitude that is responsive to the resampled residue signal.

Preferably, these structures also include a clock generator that provides a residue clock signal to the residue sampler and a feedback clock signal to the feedback sampler wherein a sample mode of one of the residue clock signal and the feedback clock signal is substantially time coincident with a hold mode of the other of the residue clock signal and the feedback clock signal.

The novel features of the invention are set forth with particularity in the appended claims. The invention will be best understood from the following description when read in conjunction with the accompanying drawings.

BRIEF DESCRIPTION OF THE DRAWINGS

FIG. 5 is a flow diagram of process steps in the control system of FIG. 2; and

FIG. 6 is an exemplary schematic of a clock generator in the control system of FIG. 3.

DETAILED DESCRIPTION OF THE PREFERRED EMBODIMENTS

Figure 2:
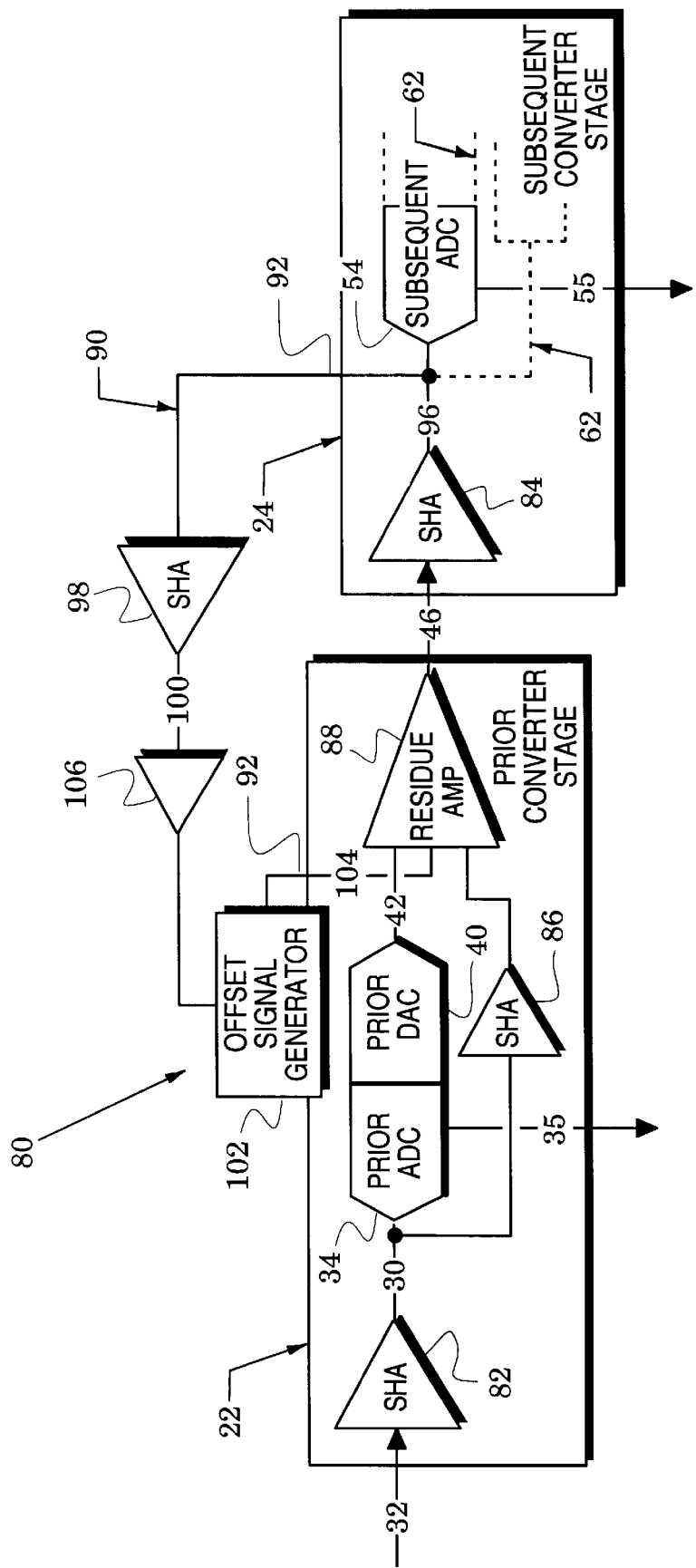
FIG. 2 is a conceptual block diagram of a control system of the present invention for reducing residue signal offset in subranging ADCs.

FIG. 2 illustrates a feedback control system 80 that eliminates or reduces sources of performance degradation (e.g., excessive noise generation, uncorrected offset errors and clock-to-clock offset changes) in subranging ADCs.

Figure 1:
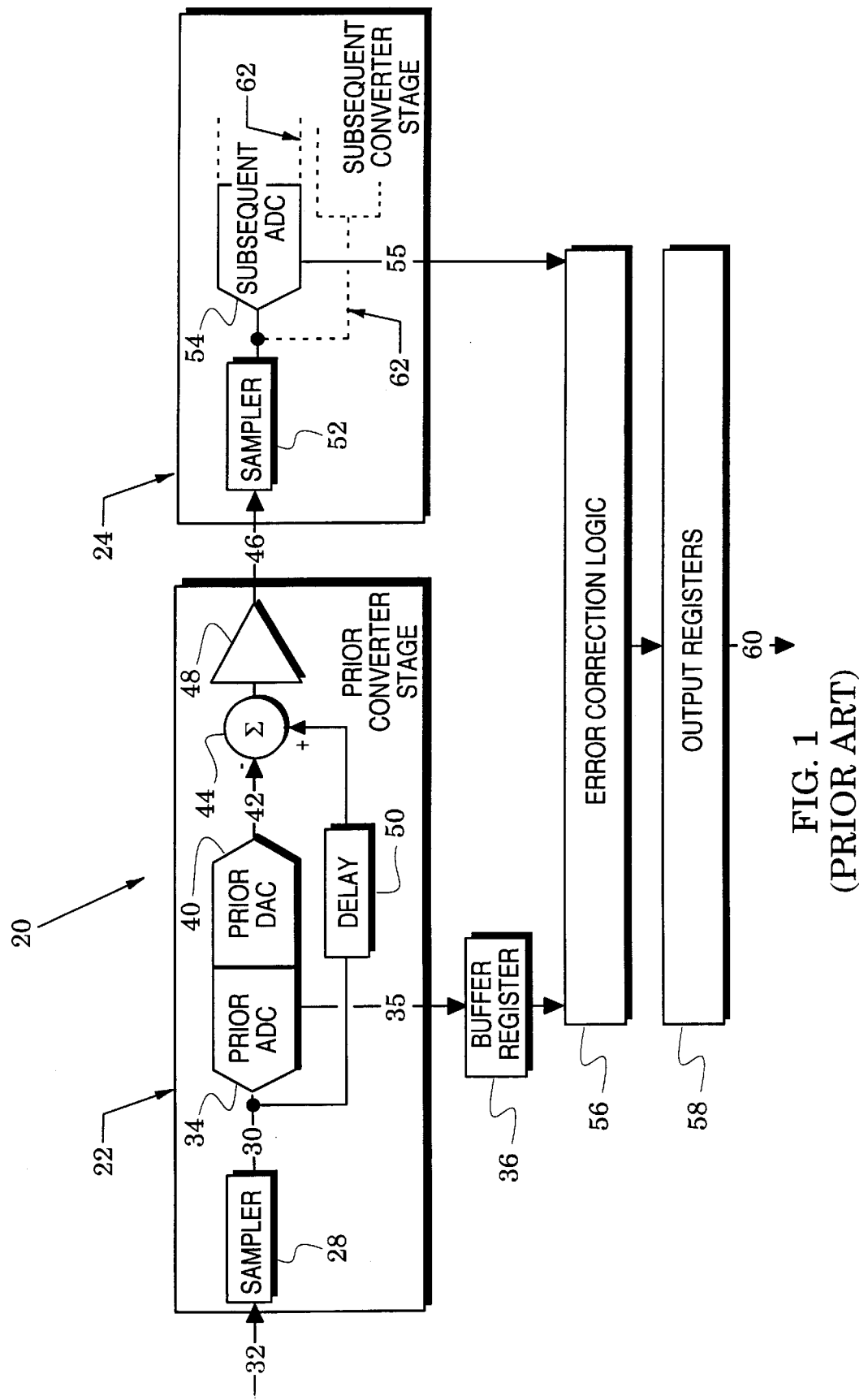
FIG. 1 is a block diagram of an exemplary subranging ADC.

The control system is shown in association with the prior and subsequent converter stages 22 and 24 of FIG. 1 wherein like elements of FIG. 1 are indicated by like reference numbers. In FIG. 2, the samplers 28 and 52 of FIG. 1 are formed with prior and subsequent sample-hold amplifiers (SHAs) 82 and 84 and the delay 50 is realized with a delay SHA 86. In addition, the separate functions of the subtractor 44 and residue amplifier 48 of FIG. 1 are performed in a residue amplifier 88.

The control system 80 inserts a feedback loop 90 that extends along a feedback path 92 which begins at the output of the subsequent SHA 84 and ends at an input of the residue amplifier 88. The subsequent SHA generates a sampled residue signal 96 and the feedback loop includes a feedback SHA 98 that responds to the sampled residue signal by generating a resampled residue signal 100.

An offset signal generator 102 generates an offset signal 104 with an amplitude that is responsive to the magnitude of the resampled feedback signal 100. The residue amplifier 88 receives the offset signal 104 and level-shifts the residue signal 46 in response to the amplitude of the offset signal 104). The feedback loop 90 preferably includes a feedback amplifier 106 that is positioned between the feedback SHA 98 and the offset signal generator 102.

In particular, the feedback SHA 98 responds to the common-mode level of the sampled residue signal 96. Accordingly, the feedback control system 80 reduces residue-signal offset errors and avoids the undesirable effects of conventional offset error control systems (e.g., uncorrected offset errors and clock-to-clock offset changes). An understanding of these advantages is facilitated with a description of an exemplary embodiment 80E of FIG. 3.

The embodiment 80E of the feedback control system 80 is shown in association with the prior ADC 34, prior DAC 40 and subsequent SHA 84 of FIG. 2. Because subranging ADCs are generally structured to process differential signals, the input signal 32 is now a differential signal as is the sampled input signal 30 which flows to the prior ADC 34 and to the prior residue amplifier 88. For clarity of illustration, the delay SHA 86 of FIG. 2 is shown in broken lines as two different portions.

The residue amplifier 88 includes differential amplifiers 112 whose ports of a first polarity receive the sampled input signal 30 and whose ports of a second polarity receive the analog signal 42 from the prior DAC 40. A source resistor 114 couples the latter ports and feedback resistors 116 couple the latter ports to respective outputs of the differential amplifiers 112.

The differential residue signal 46 is received by a differential subsequent SHA 84 that generates a differential sampled residue signal 96 across a signal divider 120. The signal divider is formed by a pair of resistors that are serially connected across the differential output port of the subsequent SHA 84. Preferably, the resistors have the same resistance so that the signal at their junction is the common-mode level of the sampled residue signal 96.

The feedback SHA 98 is formed by a single-ended amplifier 122 that charges a capacitor 124 through a switch 126 and a series resistor 128. The signal divider 120 and the feedback SHA 98 process the sampled residue signal 96 into the resampled residue signal 100 and deliver the latter signal to the differential feedback amplifier 106 which compares it to a common-mode reference signal $S_{CM}$.

An amplified version of the difference between the common mode signal from the feedback SHA 98 and the reference signal $S_{CM}$ is received by the offset current generator 102 which generates an offset current with a corresponding magnitude. In an exemplary realization of the prior DAC 40 and the offset current generator 102, the prior DAC 40 sinks currents 132 and the offset current generator sources currents 134 wherein the sink and source currents both vary over a 12 milliampere range.

Finally, the feedback control system 80 includes a clock generator 140 that delivers a sample clock signal 142 and a resample clock signal 144 respectively to the subsequent SHA 84 and the feedback SHA 98.

Figure 3:
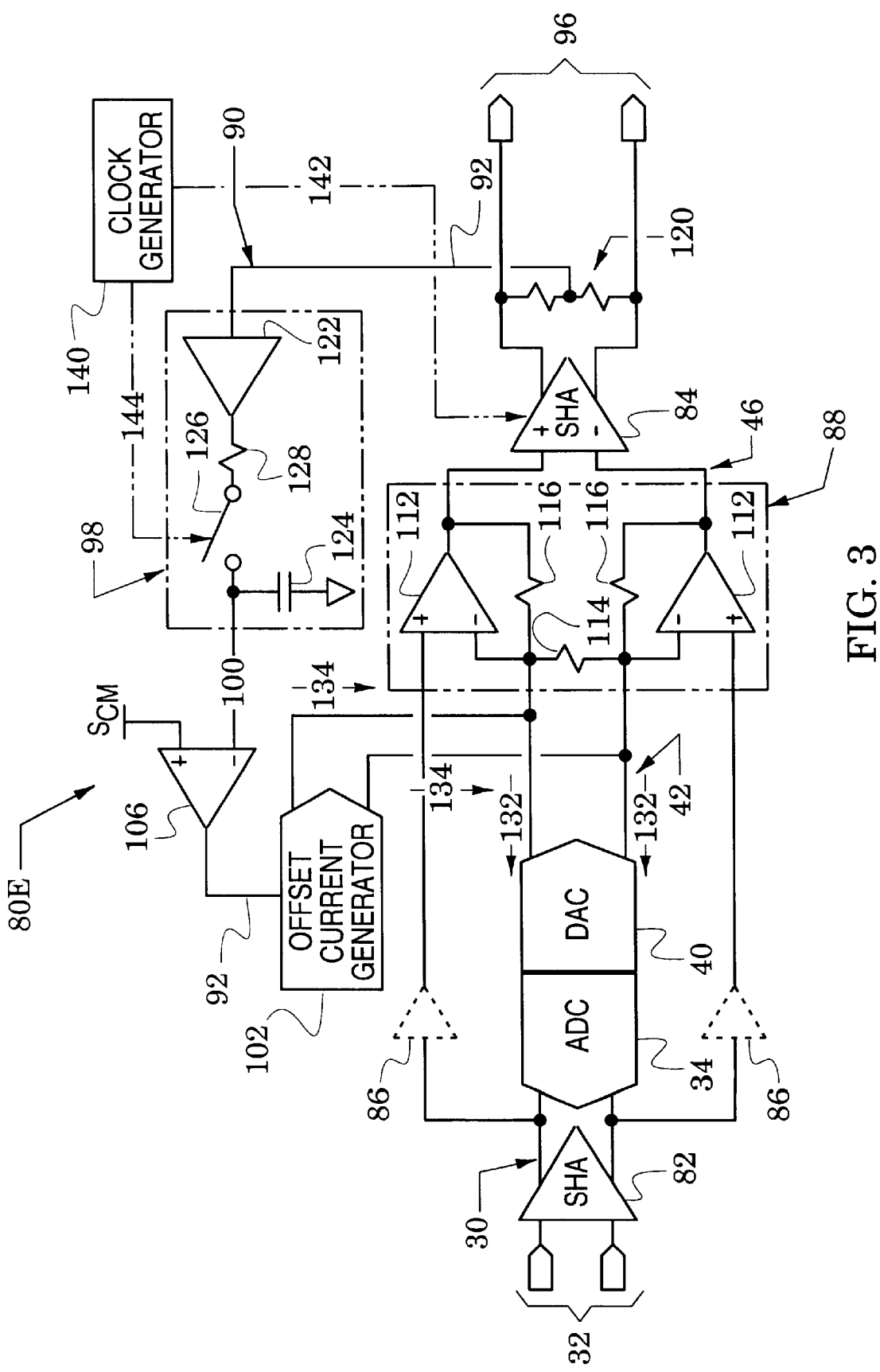
FIG. 3 is an exemplary schematic of the control system of FIG. 2.
Figure 4:
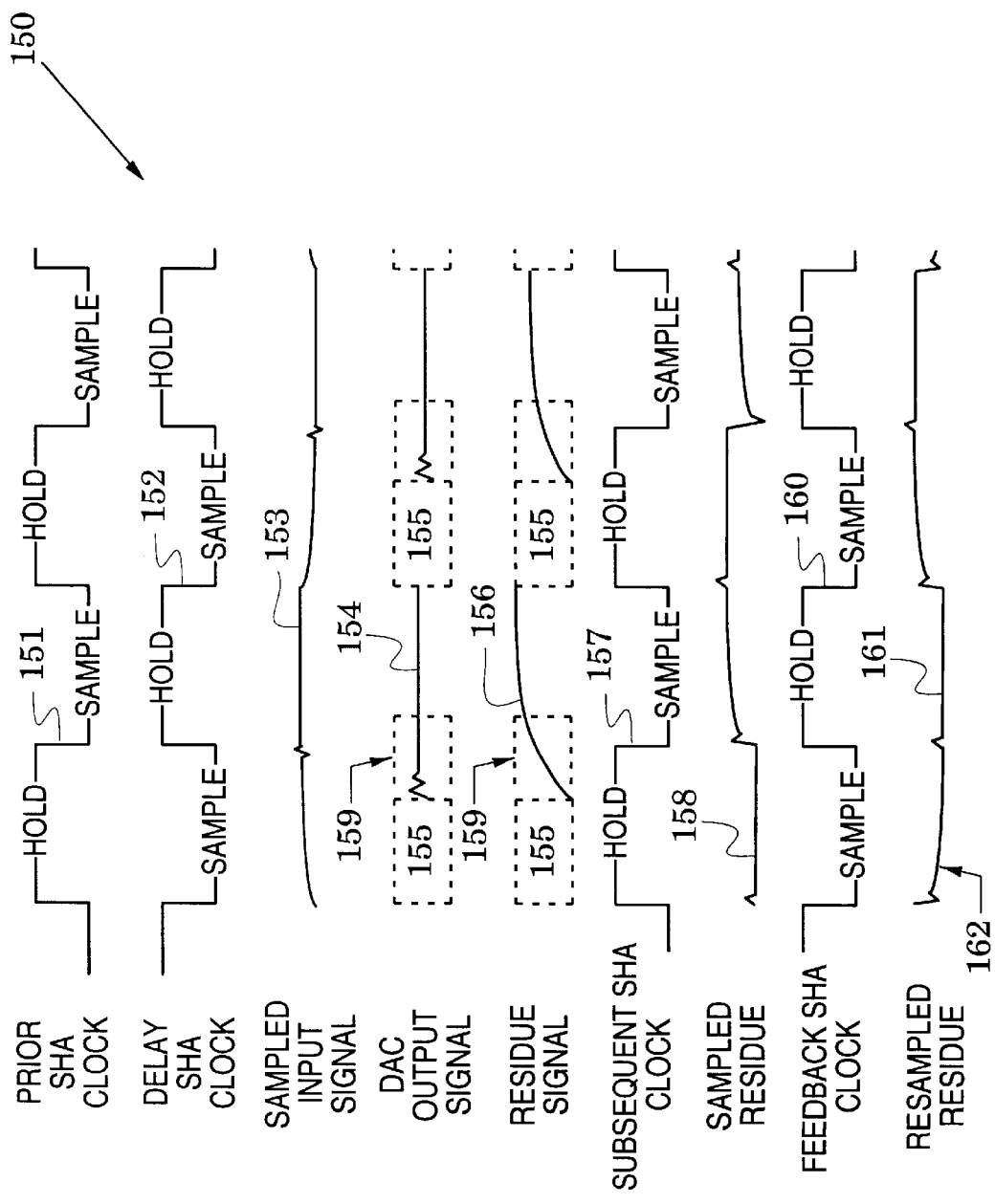
FIG. 4 is a timing diagram that shows exemplary waveforms in the control system of FIG. 2.

An operational description of the control systems of the invention is enhanced with reference to the timing diagram 150 of FIG. 4. For diagram simplicity and clarity, these waveforms are directed to the conceptual system of FIG. 2 rather than the differential schematic of FIG. 3.

The clock waveforms 151 and 152 of FIG. 4 are respectively applied to the prior SHA (82 in FIG. 2) and the delay SHA (86 in FIG. 2) and the clock 152 is phase shifted by 180° so that a version 153 of the sampled input signal is time shifted for presentation to the residue amplifier (88 in FIG. 2).

The prior DAC (40 in FIG. 2) responds to the prior bits (35 in FIG. 2) by generating a signal such as the waveform 154 (which is typically a current signal). The cells in the DAC have a response time during which their output signal is uncertain. For illustration clarity, the signal at this time is simply indicated as an empty broken-line box 155.

The residue signal is the difference between waveforms 153 and 154 and is shown as waveform 156 which, accordingly, also has an uncertain signal during the time intervals 154. The residue signal 156 changes levels with a time constant that is dictated by the finite bandwidth of the residue amplifier. The residue signal 156 is then sampled by the subsequent SHA (84 in FIG. 2) with a sample clock 157 that has a 180° phase shift from the delay SHA clock 152. This sampling generates the sampled residue signal 158.

To facilitate the waveform description to this point, it was assumed above that the response time 155 of the cells in the DAC terminates before the advent of the next sample phase of the sample clock 157. There is a statistical probability that one or more latches in the DAC cells will, in fact, take longer to become valid (typically, each DAC bit is provided by a respective latch). In some operational modes, therefore, the uncertain-signal time intervals 155 extend into the sample phase as indicated by the broken-line extensions 159.

When this happens, spurious signals are reflected into the sampled residue signal 158. If these spurious signals are not blocked in the feedback path (92 in FIG. 2), they substantially degrade analog-to-digital signal conversion in the subranging structure.

Accordingly, the resample clock 160 is shifted substantially 180° in phase from the sample clock 157 so that the feedback SHA (98 in FIG. 2) is sampling when the subsequent SHA (84 in FIG. 2) is holding. This process blocks the spurious signals from traveling further along the feedback path 92. The feedback SHA therefore generates a resampled signal 161 that is free of spurious signals with a consequent enhancement of the fidelity of the analog-to-digital signal conversion.

Level changes 162 in the resampled signal 161 take place with an RC time constant in which R and C are the resistance and capacitance respectively of the capacitor 124 and the series resistor 128 of the feedback SHA 98 of FIG. 3. Selection of this time constant is explored below with reference to an exemplary prototype of the invention.

The control processes of the feedback structures of FIG. 2 are summarized in the flow diagram 170 of FIG. 5. In a first process step 172, an analog input signal that is processed by a prior converter stage (signal 30 and stage 22 in FIG. 2) and an analog output signal that is generated by the prior converter stage (signal 42 in FIG. 2) are differenced to generate a residue signal (signal 46 in FIG. 2).

The residue signal is sampled in process step 174 to generate a sampled residue signal in a subsequent converter stage (signal 96 and stage 24 in FIG. 2). The sampled residue signal is then resampled in step 176 to generate a resampled residue signal (signal 100 in FIG. 2).

In the generation of the residue signal in the differencing step 172, the common-mode level of the residue signal is varied in accordance with the magnitude of the resampled residue signal as recited in process step 178 and as indicated by the feedback path 92 (which corresponds to the path 92 in FIG. 2).

Clocking of the sampling and resampling steps 174 and 176 is preferably arranged to insure that they are not time-coincident (e.g., arranged so that one step is in a sample mode when the other step is in a hold mode) and that the duration of the resampling step is sufficiently limited to insure control loop stability.

An exemplary prototype of the control system of FIG. 3 was realized with complementary bipolar structures and, accordingly, the common-mode reference signal $S_{CM}$ (reference input to amplifier 106 of FIG. 3) was set to be on the order of 2.4 volts. The prior SHA 82, subsequent SHA 84 and delay SHA 86 of FIG. 3 were configured to have a signal bandwidth in excess of 400 MHz so that their RC time constants were less than 1 nanosecond.

The gain of the feedback control loop 90 is substantially the gain of the feedback amplifier 106 and, in the prototype, this amplifier gain was set at 10. This value was determined from a consideration of several subranging parameters such as the estimated common-mode errors of the prior converter stage (22 in FIG. 2) and signal input range and "headroom" range in the subsequent converter stage (24 in FIG. 2).

The RC time constant of the feedback SHA 98 and the sample time of the resample clock 144 were then experimentally set by: a) breaking the feedback control loop 90 between the residud amplifier 88 and the subsequent SHA 84, b) inserting a common-mode step change of approximately 100 milivolts into the subsequent SHA 84 and c) observing the control-loop response at the output of the residue amplifier 88.

In particular, the residue amplifier's output was observed at its first sampling of the inserted step change and an RC time constant of 60 nanoseconds and a maximum sample time of 15 nanoseconds were selected to cause this correction signal to have an amplitude that was approximately 70% of the disturbance signal's amplitude. Essentially, a combination of the RC time constant and the sample time determines the location of a sampled-data dominant pole that insures a stable control loop.

Accordingly, a sufficient stability margin will be obtained if the resample time (as set by the resample clock 144) is limited to 15 nanoseconds. This limitation is met when the clock rate exceeds 33 MSPS. To meet this limitation at lower data rates, the clock generator 140 is preferably includes structure such as that shown in FIG. 6.

As shown in this figure, the ADC clock is provided directly as the sampling clock (line 142 in FIG. 3). The ADC clock is also passed through an inverter 180 whose output is coupled directly to an AND gate 182 and is also coupled to a pulse generator 184 whose output pulse is coupled to the AND gate 182. The output of the AND gate then serves as the resampling clock (line 144 in FIG. 3). If the pulse generator 184 is set to generate a pulse of 15 nanoseconds, the resample time will be limited to this value for ADC clock rates that are less than 33 MSPS and will be less than this value for ADC clock rates that exceed 33 MSPS.

Control systems of the invention are suitable for use at high speed clock rates (e.g., on the order of 80 MSPS). Their feedback structure reduces offset errors of all prior converter stages while avoiding excessive noise generation and clock-to-clock offset changes.

Although prototypes of the invention were realized with a complementary bipolar process, the teachings of the invention may be practiced with any transistors that have current terminals responsive to a control terminal (e.g., complementary metal-oxide transistors).

The teachings of the invention have been described with reference to SHAs which typically include an energy storage element that is preceded by a switch and an input buffer amplifier and is followed by an output buffer amplifier but these teachings may be practiced with various sampler structures.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A control system for reducing residue signal offset errors in subranging analog-to-digital converters that have at least one combination of a prior converter stage and a subsequent converter stage wherein said prior converter stage includes a prior analog-to-digital converter and a corresponding prior digital-to-analog converter, the control system comprising:
    a residue amplifier in said prior converter stage that generates, in response to an input signal, a residue signal with a common-mode level that is responsive to an offset signal;
    a residue sampler in said subsequent converter stage that samples said residue signal to produce a sampled residue signal; and
    a feedback loop around said residue sampler and said residue amplifier that includes:
        a) a feedback sampler that resamples said sampled residue signal to produce a resampled residue signal; and
        b) an offset signal generator that delivers said offset signal to said residue amplifier with a signal magnitude that is responsive to said resampled residue signal.

2. The control system of claim 1, wherein said offset signal is a current signal.

3. The control system of claim 1, wherein said feedback loop further includes a feedback amplifier inserted between said feedback sampler and said offset signal generator.

4. The control system of claim 1, further including a clock generator that provides a residue clock signal to said residue sampler and a feedback clock signal to said feedback sampler wherein a sample mode of one of said residue clock signal and said feedback clock signal is substantially time coincident with a hold mode of the other of said residue clock signal and said feedback clock signal.

5. A control system for reducing residue signal offset errors in subranging analog-to-digital converters that have at least one combination of a prior converter stage and a subsequent converter stage wherein said prior converter stage includes a prior analog-to-digital converter and a corresponding prior digital-to-analog converter, the signal offset system comprising:
    a residue amplifier in said prior converter stage that generates, in response to an input signal, a residue signal with a common-mode level that is responsive to an offset signal;
    a residue sampler in said subsequent converter stage that samples said residue signal to produce a sampled residue signal; and
    a feedback loop around said residue sampler and said residue amplifier that includes:
        a) a feedback sampler that resamples said sampled residue signal to produce a resampled residue signal; and
        b) an offset signal generator that delivers said offset signal to said residue amplifier with a signal magnitude that is responsive to said resampled residue signal;
    wherein:
        said residue sampler has differential input and output ports; and
        said residue amplifier has a differential output port and an input port that includes:
            a) a first port for reception of a differential analog input signal that is processed by said prior converter stage; and
            b) a second port for reception of a differential analog output signal that is generated by said prior converter stage.

6. The control system of claim 5, wherein said residue sampler includes a signal divider across its differential output port and said feedback sampler receives said sampled residue signal from said signal divider.

7. The control system of claim 1, wherein said residue sampler and said feedback sampler are both sample-hold amplifiers.

8. A method of controlling a common-mode level of a residue signal in subranging analog-to-digital converters that have at least one combination of a prior converter stage and a subsequent converter stage, the method comprising the steps of:
    differencing an analog input signal that is processed by said prior converter stage and an analog output signal that is generated by said prior converter stage to generate said residue signal;
    sampling said residue signal to generate a sampled residue signal in said subsequent converter stage;
    resampling said sampled residue signal to generate a resampled residue signal; and
    in the generation of said residue signal in said differencing step, varying said common-mode level of said residue signal in accordance with the magnitude of said resampled residue signal.

9. The method of claim 8, wherein said resampling step includes the step of resampling a common-mode level of said sampled residue signal.

10. The method of claim 8, wherein said varying step includes the steps of:
    generating an offset current with a magnitude responsive to the magnitude of said resampled residue signal; and
    adjusting said common-mode level of said residue signal in accordance with the magnitude of said offset current.

11. The method of claim 10, wherein said generating step includes a step of amplifying said resampled residue signal.

12. A method of controlling a common-mode level of a residue signal in subranging analog-to-digital converters that have at least one combination of a prior converter stage and a subsequent converter stage, the method comprising the steps of:
    differencing an analog input signal that is processed by said prior converter stage and an analog output signal that is generated by said prior converter stage to generate said residue signal;
    sampling said residue signal to generate a sampled residue signal in said subsequent converter stage;
    resampling said sampled residue signal to generate a resampled residue signal; and
    in the generation of said residue signal in said differencing step, varying said common-mode level of said residue signal in accordance with the magnitude of said resampled residue signal;

and further including a step of shifting the time occurrence of said sampling and resampling steps so that they are not time coincident.

13. The method of claim 12, further including a step of shifting the time occurrence of said sampling step substantially 180° in phase from said resampling step.

14. A subranging analog-to-digital converter that converts an analog signal into a digital signal that includes at least a set of prior digital bits and a set of subsequent digital bits that are less significant than said prior digital bits, comprising:

a prior converter stage that converts said analog signal into said prior set of digital bits and generates a residue signal;

a subsequent converter stage that converts said residue signal into said subsequent set of digital bits;

a residue amplifier in said prior converter stage that generates, in response to an input signal, said residue signal with a common-mode level that is responsive to an offset signal;

a residue sampler in said subsequent converter stage that samples said residue signal to produce a sampled residue signal; and a feedback loop around said residue sampler and said residue amplifier that includes:
 a) a feedback sampler that resamples said sampled residue signal to produce a resampled residue signal; and
 b) an offset signal generator that delivers said offset signal to said residue amplifier with a signal magnitude that is responsive to said resampled residue signal.

15. The subranging analog-to-digital converter of claim 14, wherein said feedback loop further includes a feedback amplifier inserted between said feedback sampler and said offset signal generator.

16. The subranging analog-to-digital converter of claim 14, further including a clock generator that provides a residue clock signal to said residue sampler and a feedback clock signal to said feedback sampler wherein a sample mode of one of said residue clock signal and said feedback clock signal is substantially time coincident with a hold mode of the other of said residue clock signal and said feedback clock signal.

17. A subranging analog-to-digital converter that converts an analog signal into a digital signal that includes at least a set of prior digital bits and a set of subsequent digital bits that are less significant than said prior digital bits, comprising:

a prior converter stage that converts said analog signal into said prior set of digital bits and generates a residue signal;

a subsequent converter stage that converts said residue signal into said subsequent set of digital bits;

a residue amplifier in said prior converter stage that generates, in response to an input signal, said residue signal with a common-mode level that is responsive to an offset signal;

a residue sampler in said subsequent converter stage that samples said residue signal to produce a sampled residue signal; and a feedback loop around said residue sampler and said residue amplifier that includes:
 a) a feedback sampler that resamples said sampled residue signal to produce a resampled residue signal; and
 b) an offset signal generator that delivers said offset signal to said residue amplifier with a signal magnitude that is responsive to said resampled residue signal;

wherein:

said residue sampler has differential input and output ports;

said residue amplifier has a differential output port; and said residue amplifier has an input port that includes:
 a) a first port for reception of a differential analog input signal that is processed by said prior analog-to-digital converter; and
 b) a second port for reception of a differential analog signal from said prior digital-to-analog converter.

18. The subranging analog-to-digital converter of claim 14, wherein said residue sampler and said feedback sampler are both sample-hold amplifiers.

19. The subranging analog-to-digital converter of claim 14, wherein said prior converter stage further includes:

a prior analog-to-digital converter; and a prior digital-to-analog converter responsive to said prior analog-to-digital converter;

and wherein said said subsequent converter stage further includes at least a subsequent analog-to-digital converter;

and further including:
 a buffer register for holding said prior set of digital bits;
 an error-correction logic circuit for receiving said prior set of digital bits from said buffer register and said subsequent set of digital bits from said subsequent converter stage; and
 an output register for receiving corrected digital bits from said error-correction logic circuit.

20. The control system of claim 14, wherein said offset signal is a current signal.

21. A control system for reducing residue signal offset errors in subranging analog-to-digital converters, comprising:

a residue amplifier that generates a residue signal with a common-mode level that is responsive to an offset signal that is applied to said residue amplifier;

a residue sampler that samples said residue signal to produce a sampled residue signal; and a feedback loop around said residue sampler and said residue amplifier that resamples said sampled residue signal to produce a resampled residue signal and delivers said offset signal to said residue amplifier with a signal magnitude that is responsive to said resampled residue signal.

22. The control system of claim 21, wherein said feedback loop includes:

a feedback sampler that resamples said sampled residue signal to produce said resampled residue signal; and an offset signal generator that delivers said offset signal to said residue amplifier with a signal magnitude that is responsive to said resampled residue signal.

23. The control system of claim 22, wherein said residue sampler and said feedback sampler are both sample-hold amplifiers.

24. The control system of claim 22, further including a clock generator that provides a residue clock signal to said residue sampler and a feedback clock signal to said feedback sampler wherein a sample mode of one of said residue clock signal and said feedback clock signal is substantially time coincident with a hold mode of the other of said residue clock signal and said feedback clock signal.

* * * * *